US012701742B2

(12) United States Patent
Shimomura et al.

(10) Patent No.: US 12,701,742 B2
(45) Date of Patent: Aug. 4, 2026

(54) SEMICONDUCTOR DEVICE AND METHOD FOR MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Saya Shimomura, Komatsu Ishikawa (JP); Hiroaki Katou, Nonoichi Ishikawa (JP)

(73) Assignees: Kabushiki Kaisha Toshiba; Toshiba Electronic Devices & Storage Corporation

( * ) Notice: Subject to any disclaimer, the term of this patent is extended or adjusted under 35 U.S.C. 154(b) by 821 days.

(21) Appl. No.: 18/179,294

(22) Filed: Mar. 6, 2023

(65) Prior Publication Data

US 2024/0097024 A1     Mar. 21, 2024

(30) Foreign Application Priority Data

Sep. 20, 2022     (JP) ................................. 2022-149522

(51) Int. Cl.
　　*H10D 30/66*　　(2025.01)
　　*H10D 30/01*　　(2025.01)
　　(Continued)

(52) U.S. Cl.
　　CPC ....... *H10D 30/668* (2025.01); *H10D 30/0297* (2025.01); *H10D 64/01* (2025.01); *H10D 64/117* (2025.01)

(58) Field of Classification Search
　　CPC .. H10D 30/668; H10D 30/0297; H10D 64/10; H10D 64/117
　　(Continued)

(56) References Cited

U.S. PATENT DOCUMENTS

| | | |
|---|---|---|
| 6,870,220 B2 | 3/2005 | Kocon et al. |
| 7,504,303 B2 | 3/2009 | Yilmaz et al. |

(Continued)

FOREIGN PATENT DOCUMENTS

| | | |
|---|---|---|
| JP | 2008227514 A | 9/2008 |
| JP | 2008546189 A | 12/2008 |

(Continued)

OTHER PUBLICATIONS

Kobayashi et al. "100-V Class Two-step-oxide Field-Plate Trench MOSFET to Achieve Optimum RESURF Effect and Ultralow On-resistance," Proceedings of the 31st International Symposium on Power Semiconductor Devices and ICs (ISPSD), Shanghai, China, May 19-23, 2019, pp. 99-102.

(Continued)

*Primary Examiner* — Igwe U Anya
(74) *Attorney, Agent, or Firm* — Kim & Stewart LLP

(57) ABSTRACT

According to one embodiment, a semiconductor device includes a first electrode, a second electrode, a first region, a second region, a third region, a first conductive portion, a second conductive portion, a gate electrode, a first insulating portion, a second insulating portion, a third insulating portion, and a fourth insulating portion. The second electrode has a first portion and a second portion extending from the first portion toward the first electrode. The first region is between the first electrode and the second electrode. The second region is between the first region and the second electrode. The third region is between the second semiconductor region and the second electrode. The first conductive portion is in the first semiconductor region. The gate electrode is between the second region and the second portion. The second conductive portion is between the first conductive portion and the gate electrode.

20 Claims, 13 Drawing Sheets

(51) Int. Cl.
   H10D 64/00          (2025.01)
   H10D 64/01          (2025.01)

(58) Field of Classification Search
   USPC .......................................................... 257/330
   See application file for complete search history.

(56)                    References Cited

U.S. PATENT DOCUMENTS

| | | | |
|---|---|---|---|
| 2013/0134505 A1 | 5/2013 | Kobayashi | |
| 2015/0349091 A1* | 12/2015 | Yilmaz | H10D 64/117 |
| | | | 438/270 |
| 2017/0077273 A1 | 3/2017 | Kitagawa | |
| 2018/0083110 A1 | 3/2018 | Kobayashi et al. | |
| 2019/0109215 A1 | 4/2019 | Yamashita et al. | |
| 2020/0259011 A1 | 8/2020 | Arai | |
| 2020/0303495 A1 | 9/2020 | Yamashita et al. | |
| 2020/0328320 A1* | 10/2020 | Wasserman | H10F 71/1272 |
| 2021/0028305 A1* | 1/2021 | Hsieh | H10D 30/0297 |
| 2021/0328027 A1 | 10/2021 | Gangi | |
| 2022/0393011 A1* | 12/2022 | Shin | H10D 30/0411 |

FOREIGN PATENT DOCUMENTS

| | | | |
|---|---|---|---|
| JP | 4731165 | B2 | 7/2011 |
| JP | 2013115225 | A | 6/2013 |
| JP | 6416062 | B2 | 10/2018 |
| JP | 6440220 | B2 | 12/2018 |
| JP | 2019071384 | A | 5/2019 |
| JP | 2019140152 | A | 8/2019 |
| JP | 6649216 | B2 | 2/2020 |
| JP | 6730394 | B2 | 7/2020 |
| JP | 2020129646 | A | 8/2020 |
| JP | 2020155475 | A | 9/2020 |
| JP | 2021170583 | A | 10/2021 |
| WO | 2005065385 | A2 | 7/2005 |

OTHER PUBLICATIONS

Sodhi et al. "Integrated Design Environment for DC/DC Converter FET Optimization," Proceedings of the 11th International Symposium on Power Semiconductor Devices and ICs (ISPSD), Toronto, ON, Canada, 1999, pp. 241-244.
Japanese Office Action dated Oct. 10, 2025, mailed in counterpart Japanese Application No. 2022-149522, 8 pages.

* cited by examiner

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-149522, filed Sep. 20, 2022, the entire contents of which are incorporated herein by reference.

FIELD

Embodiments described herein relate generally to a semiconductor device and a method for manufacturing a semiconductor device.

BACKGROUND

A semiconductor device such as a metal-oxide semiconductor field-effect transistor (MOSFET) can be used as a switching device. Such a semiconductor device is required to achieve high switching efficiency, avoid breakage, and have low resistance during an on-state operations.

BRIEF DESCRIPTION OF THE DRAWINGS

FIG. 2B is a cross-sectional view at line C-C' of FIG. 2A.

FIG. 2C is a cross-sectional view at line D-D' of FIG. 2A.

DETAILED DESCRIPTION

Figures 1A, 1B, 1C:
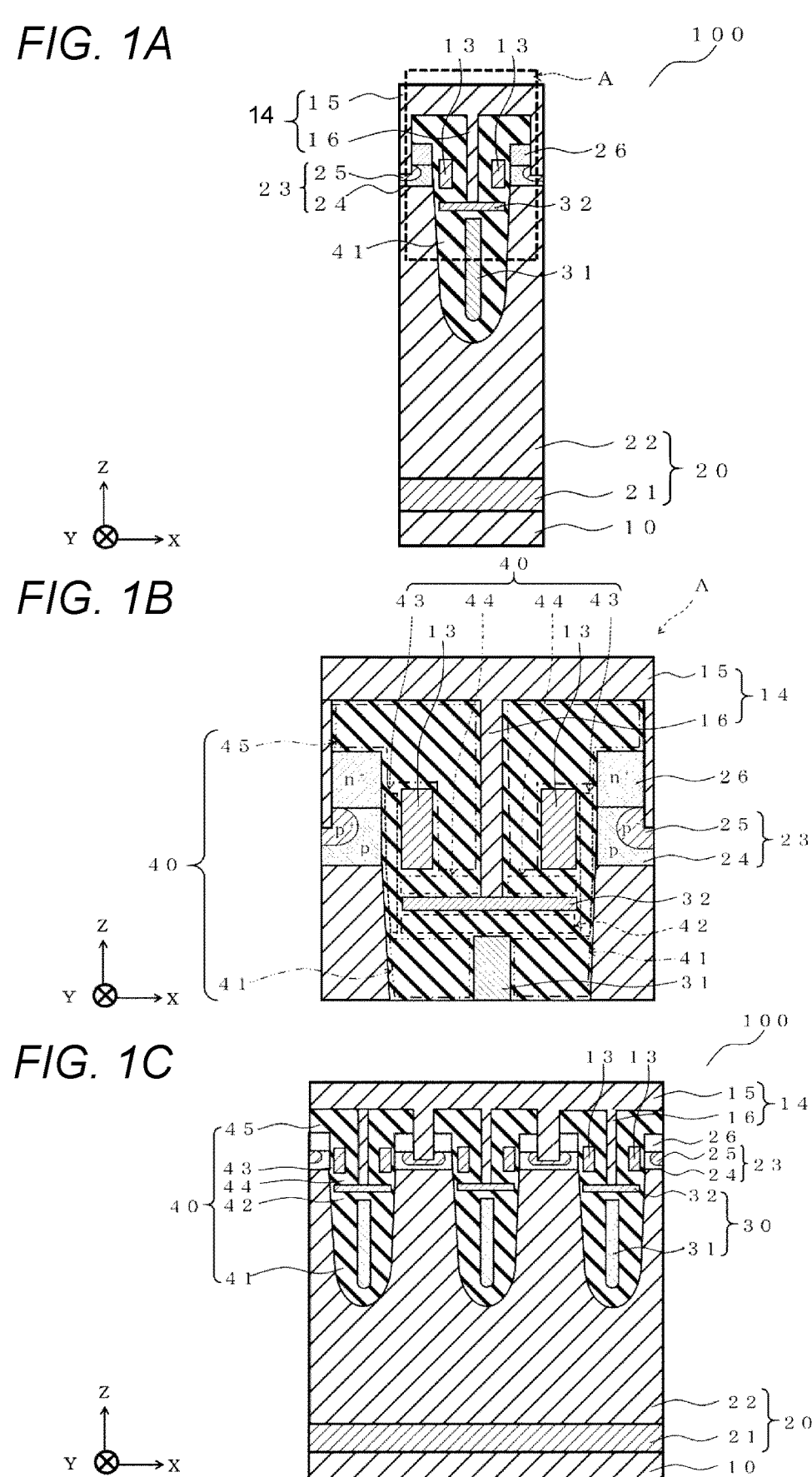
FIG. 1A is a cross-sectional view of a semiconductor device according to a first embodiment.
FIG. 1B is a cross-sectional view showing the broken-line area A of FIG. 1A in more detail.
FIG. 1C is another cross-sectional view of a semiconductor device according to a first embodiment.

Embodiments concern a semiconductor device which can prevent the occurrence of breakage.

In general, according to one embodiment, a semiconductor device includes a first electrode and a second electrode spaced from the first electrode in a first direction. A first semiconductor region of a first conductivity type is between the first electrode and the second electrode and electrically connected to the first electrode. A plurality of second semiconductor regions of a second conductivity type is between the first semiconductor region and the second electrode and spaced from one another in a second direction intersecting the first direction. A semiconductor region of the first conductivity type is electrically connected to the second electrode and between the second semiconductor regions and the second electrode in the first direction. A first conductive portion is adjacent to the first semiconductor region in the second direction. A first insulating portion is between the first conductive portion and the first semiconductor region in the second direction. A gate electrode is between adjacent pairs of the second semiconductor regions in the second direction. A second conductive portion is between the first conductive portion and the gate electrode in the first direction. A second insulating portion is between the first conductive portion and the second conductive portion in the first direction. A third insulating portion is between the gate electrode and adjacent second semiconductor regions in the second direction and the first semiconductor region and the second conductive portion in the second direction. A fourth insulating portion is between the gate electrode and the second conductive portion in the first direction. The second electrode has a first portion spaced from the third semiconductor region in the first direction and a second portion that extends from the first portion in the first direction and contacts the second conductive portion.

According to another embodiment, a method for manufacturing a semiconductor device includes: forming a trench in a first semiconductor region of a first conductivity type from a surface of the first semiconductor region in a first direction; forming a first insulating portion on the surface of the trench; and forming a first conductive portion in the trench on the first insulating portion. The method further includes: forming a second insulating portion in the trench; removing a part of the first insulating portion and a part of the second insulating portion to expose an upper part of the inner wall of the trench; oxidizing the surface of the first insulating portion and the surface of the second insulating portion to form a second insulating portion and a part of a third insulating portion; forming a second conductive portion on the surface of the second insulating portion; and oxidizing the surface of the second conductive portion and the exposed inner wall of the trench to form a part of a third insulating portion and a fourth insulating portion. The method further includes: forming a gate electrode on the surface of the third insulating portion and a part of the surface of the fourth insulating portion; forming a second semiconductor region of a second conductivity type in the first semiconductor region, the second semiconductor region facing the gate electrode via the third insulating portion in the second direction; and forming a third semiconductor region of a first conductivity type between the surface of the trench and the second semiconductor region.

Certain non-limiting example embodiments of the present disclosure will be described with reference to the drawings. In the drawings and the description below, aspects, components, elements, or the like which are substantially the same are given the same reference symbol. The depicted dimensional ratios, dimensions, and the like illustrated in the drawings are not limitations of the present disclosure unless stated otherwise.

First Embodiment (Structure of Semiconductor Device 100)

The structure of a semiconductor device 100 according to a first embodiment will now be described with reference to FIGS. 1A, 1B, 1C, 2A, 2B, and 2C. FIG. 1A is a cross-sectional view of a semiconductor device 100 according to a first embodiment. FIG. 1B is a cross-sectional view showing the broken-line area A of FIG. 1A in more detail. FIG. 1C is another cross-sectional view of the semiconductor device 100 according to the first embodiment. FIG. 3 illustrates the parasitic capacitances in the semiconductor device 100 according to the first embodiment.

The following description illustrates an embodiment in which a first conductivity type is n-type and a second conductivity type is p-type. In the following description, the symbols $n^+$, n, $n^-$, $p^+$, p, and $p^-$ represent the relative levels of the impurity concentration of each conductivity type: $n^+$ indicates a relatively higher n-type impurity level than n, and $n^-$ indicates a relatively lower n-type impurity level than n; and $p^+$ indicates a relatively higher p-type impurity level than p, and $p^-$ indicates a relatively lower p-type impurity level than p. In some instances, $n^+$-type and $n^-$-type regions may be sometimes referred to simply as n-type, and $p^+$-type and $p^-$-type regions sometimes referred to simply as p-type.

The semiconductor device 100 according to the first embodiment is a MOSFET. The semiconductor device 100 includes a drain electrode 10 (first electrode), a source electrode 14 (second electrode), a gate electrode 13, an n-type first semiconductor region 20, a p-type second semiconductor region 23, an $n^+$-type third semiconductor region 26, a first conductive portion 31, a second conductive portion 32, and an insulating layer 40.

The direction going from the drain electrode 10 toward the source electrode 14 is referred to as the Z direction. A direction perpendicular to the Z direction is referred to as the X direction, and a direction perpendicular to both the X direction and the Z direction is referred to as the Y direction.

FIGS. 1A, 1B and 1C each show a cross-sectional view in an X-Z plane of the semiconductor device 100. For the purposes of description, the direction from the drain electrode 10 toward the source electrode 14 may be referred to as "upward", "above", or the like, and the opposite direction as "downward", "below", or the like.

The n-type first semiconductor region 20, the p-type second semiconductor region 23 and the $n^+$-type third semiconductor region 26 comprise silicon (Si) or silicon carbide (SiC) as a semiconductor material. When silicon is used as a semiconductor material, arsenic (As), phosphorus (P), or antimony (Sb) can be used as an n-type impurity. Boron (B) can be used as a p-type impurity.

The n-type first semiconductor region 20 has an $n^+$-type drain region 21 and an $n^-$-type drift region 22. The $n^+$-type drain region 21 is provided on the drain electrode 10 and electrically connected to the drain electrode 10. The $n^-$-type drift region 22 is provided on and above the $n^+$-type drain region 21 in the Z direction. The $n^-$-type drift region 22 is electrically connected to the drain electrode 10 via the $n^+$-type drain region 21.

The p-type second semiconductor region 23 has a p-type base region 24 and a $p^+$-type contact region 25, and is provided in plural numbers. The plurality of p-type base regions 24, which are spaced apart from each other in the X direction, are provided on the $n^-$-type drift region 22. The $p^+$-type contact region 25 is provided on each p-type base region 24. The $n^+$-type third semiconductor region 26 is an $n^+$-type source region and is provided on each p-type base region 24.

FIG. 1B is a cross-sectional enlarged view of the broken-line area A of FIG. 1A.

The insulating layer 40 includes a first insulating portion 41, a second insulating portion 42, a third insulating portion 43, a fourth insulating portion 44, and a fifth insulating portion 45. In FIG. 1B, the first insulating portion 41 and the fifth insulating portion 45 are shown in the two-dot chain lines, the second insulating portion 42 and the third insulating portion 43 are shown in the dashed lines, and the fourth insulating portion 44 is shown in the one-dot chain lines. In general, these insulating portions are formed integrally with one another and are thus portions of the same material. The insulating layer 40 comprises an insulating material such as silicon oxide. The first insulating portion 41, the second insulating portion 42, the third insulating portion 43, the fourth insulating portion 44, and/or the fifth insulating portion 45 may contain an impurity (e.g., boron). Additional aspects of the insulating layer 40 will be described below.

The first conductive portion 31 is provided in the $n^-$-type drift region 22 via the first insulating portion 41. The first conductive portion 31 is, for example, a field plate electrode. The first insulating portion 41 is a field plate insulating film and electrically insulates the first conductive portion 31 from the $n^-$-type drift region 22.

The second conductive portion 32 is provided on the first conductive portion 31 and the first insulating portion 41 via the second insulating portion 42. The second conductive portion 32 is also provided in the $n^-$-type drift region 22 via the third insulating portion 43. The third insulating portion 43 electrically insulates the second conductive portion 32 from the $n^-$-type drift region 22. The second conductive portion 32 extends in the X direction, and has a portion adjacent to the gate electrode 13 in the Z direction. The distance from the surface (an X-direction end surface) of the second conductive portion 32 that is in contact with the third insulating portion 43 to the first semiconductor region 20 is preferably less than the distance from the gate electrode 13 to the first semiconductor region 20. That is, the portion of the third insulating portion 43 adjacent to the gate electrode 13 in the X-direction is preferably thicker along the X-direction than the portion of the third insulating portion 43 adjacent to the second conductive portion 32 in the X-direction. The first conductive portion 31-side surface of the second conductive portion 32 (that is, the lower surface of the conductive portion 32) preferably has a small curvature (e.g., is substantially flat).

The first conductive portion 31, the second conductive portion 32 and the gate electrode 13 comprise a conductive material such as polysilicon. The conductive material contains an impurity (dopant) such as phosphorus.

The source electrode 14 has a first portion 15 and a second portion 16. The first portion 15 is provided on the n-type source region 26 and the $p^+$-type contact region 25. The second portion 16 extends downward from the first portion 15 and is connected directly to the second conductive portion 32. The second portion 16 lies side-by-side with the p-type base region 24 and the n$^+$-type source region 26 via a part of the insulating layer 40 in the X direction. The source electrode 14 is electrically connected to the first conductive portion 31, the second conductive portion 32, the n$^+$-type source region 26, and the p$^+$-type contact region 25.

As shown in FIGS. 1A and 1B, the gate electrode 13 is provided between the p-type base region 24/the n$^+$-type source region 26 and the second portion 16 in the X direction. The third insulating portion 43 is provided between the p-type base region 24 and the n$^+$-type source region 26 on one side and the gate electrode 13 on the other. The third insulating portion 43 electrically insulates the p-type base region 24 and the n$^+$-type source region 26 from the gate electrode 13.

The gate electrode 13 is provided above the second conductive portion 32 in the Z direction. The fourth insulating portion 44 is provided between the gate electrode 13 and the second conductive portion 32. The fourth insulating portion 44 electrically insulates the gate electrode 13 from the second conductive portion 32.

The fifth insulating portion 45 is provided between the gate electrode 13 and the second portion 16. The fifth insulating portion 45 electrically insulates the gate electrode 13 from the first portion 15 and the second portion 16 of the source electrode 14.

As shown in FIG. 1C, a plurality of gate electrodes 13 may be provided. In this case, each gate electrode 13 is provided between different portions of the p-type base region 24 and the n$^+$-type source region 26. The fifth insulating portion 45 is provided between the second portion 16 and the gate electrode 13 to electrically isolate them from each other. The third insulating portion 43 is provided between the gate electrode 13 and the p-type base region 24/the n$^+$-type source region 26 to electrically insulate.

Thus, the semiconductor device 100 has an area where a p-type base region 24, a third insulating portion 43, a gate electrode 13, a fifth insulating portion 45, a second portion 16, a fifth insulating portion 45, a gate electrode 13, a third insulating portion 43, and a p-type base region 24 are arranged in this order along the X direction. Similarly, n$^+$-type source regions 26 are provided in positions corresponding to p-type base regions 24 in the above stated order. In the semiconductor device 100, the described structure can be repeatedly provided in the X direction as shown in FIG. 1C.

Figure 2A:
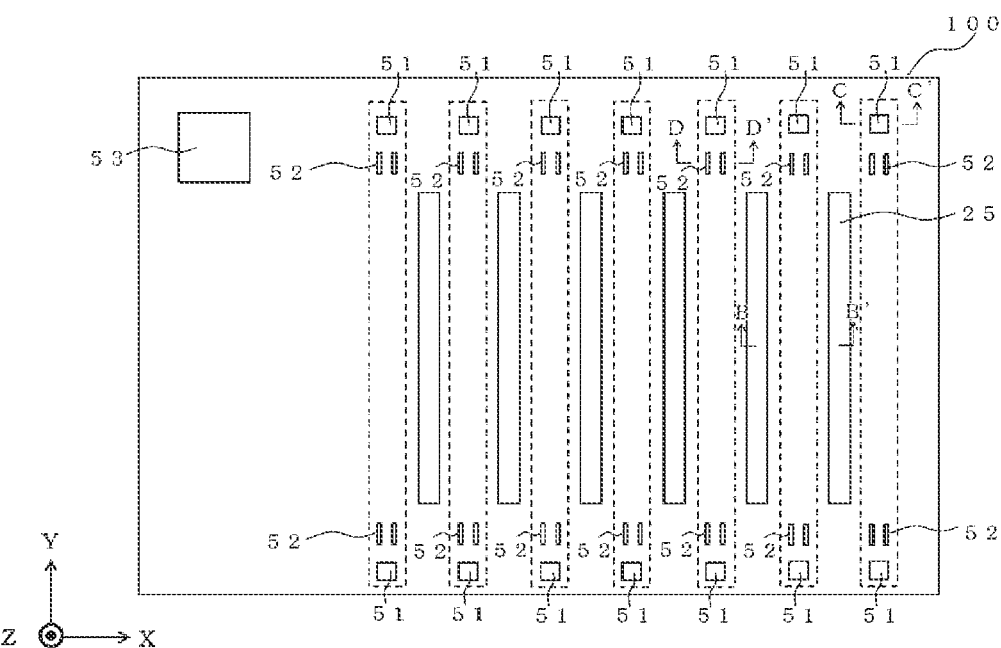
FIG. 2A is a plan view of a semiconductor device according to a first embodiment.
Figure 2A:
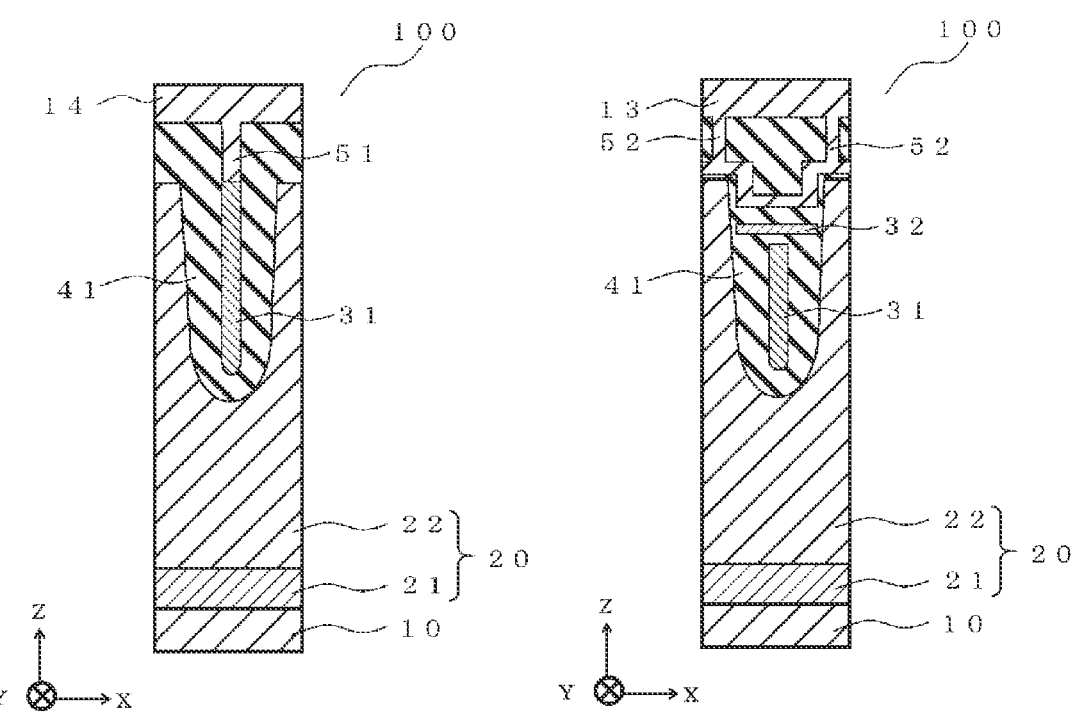
Figure 3:
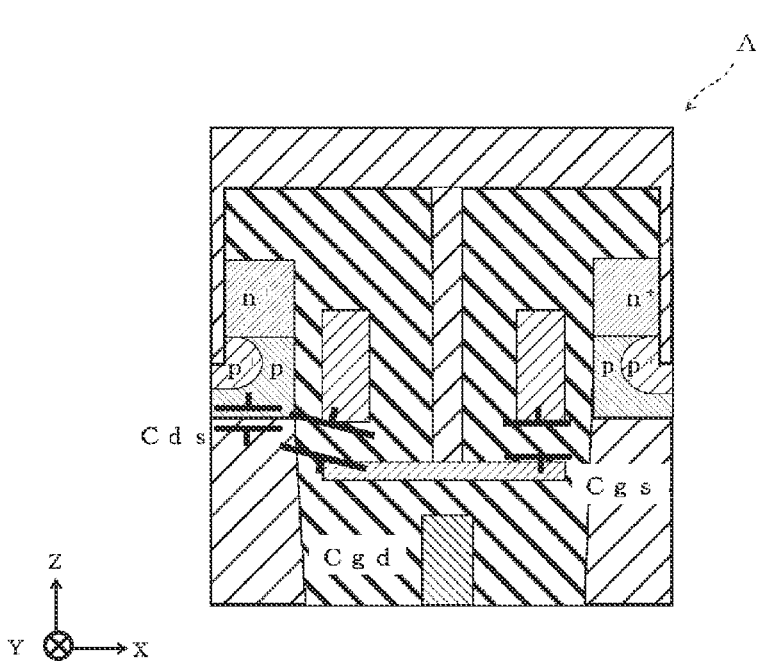
FIG. 3 is a diagram illustrating the parasitic capacitances in a semiconductor device according to a first embodiment.

FIG. 2A shows a plan view of the semiconductor device 100. The source electrode 14 shown in FIG. 1C is omitted from the depiction of FIG. 2A. The boundary between the p-type base region 24 (or, alternatively, the n$^+$-type source region 26) and the third insulating portion 43 (or, alternatively, the fifth insulating portion 45) is shown as a dashed line. As shown in FIG. 2A, the p$^+$-type contact regions 25 extend in the Y direction. Similarly, various regions provided in the semiconductor device 100, such as the p-type base region 24, the n$^+$-type source region 26, the conductive portion 30 and the gate electrode 13, also each extend in the Y direction.

In a cross-section on line B-B' of FIG. 2A, the semiconductor device 100 has the structure shown in FIG. 1A, which belongs to a device region to which an electric current is to be applied. A region which surrounds the device region and to which no electric current is to be applied is called a termination region. In the semiconductor device 100, a gate pad 53, connected to an external power source (or a gate controller), is provided in a portion of the termination region.

The n$^+$-type source region 26 and the p$^+$-type contact region 25 are electrically connected to the source electrode 14 in the device region. The second conductive portion 32 is electrically connected to the second portion 16 of the source electrode 14 in the device region.

FIG. 2B shows a cross-sectional view on line C-C' of FIG. 2A. The first conductive portion 31 extending in the Y direction is extracted to the surface side of the semiconductor device 100 via a source contact portion 51 in the termination region of the semiconductor device 100, and is electrically connected to the source electrode 14.

FIG. 2C shows a cross-sectional view on line D-D' of FIG. 2A. The gate electrode 13 extending in the Y direction is extracted to the surface side (onto the insulating layer 40) of the semiconductor device 100 via a gate contact portion 52 in the termination region of the semiconductor device 100, and is electrically connected to the gate pad 53 via a gate interconnect or the like. Though the gate interconnect is not specifically depicted, it may be formed on the termination region of the semiconductor device 100 but is electrically isolated from the source electrode 14.

In this embodiment, the source contact portion 51 is located nearer to the termination region of the semiconductor device 100 than is the gate contact portion 52. The locations where the source contact portion 51 and the gate contact portion 52 are formed can be changed by appropriately by changing the design of the gate electrode 13 and the first conductive portion 31. The gate contact portion 52 may be located nearer to the termination region than is the source contact portion 51.

As shown in FIG. 3, MOSFETs generally have parasitic capacitances. Parasitic capacitances that affect switching characteristics are mainly a gate-source capacitance Cgs, a gate-drain capacitance Cgd, and a drain-source capacitance Cds. The gate-source capacitance Cgs is formed between the gate electrode 13 and the second conductive portion 32 via the fourth insulating portion 44. The gate-drain capacitance Cgd is formed between the gate electrode 13 and the first semiconductor region 20 via the third insulating portion 43 and the fourth insulating portion 44. The drain-source capacitance Cds is formed between the first semiconductor region 20 and the second semiconductor region 23.

(Operation of Semiconductor Device 100)

First, a turn-on operation will be described. A voltage equal to or higher than a threshold value is applied to the gate electrode 13 while a positive voltage is applied to the drain electrode 10, whereby a channel (inversion layer) is formed in the p-type base region 24 adjacent to the gate electrode 13 via the third insulating portion 43, and the semiconductor device 100 turns to an on state. Electrons flow from the source electrode 14 through the channel to the drain electrode 10. Thus, an electric current flows from the drain electrode 10 to the source electrode 14 when the semiconductor device 100 is in the on state.

Next, a turn-off operation will be described. When a voltage lower than the threshold value is applied to the gate electrode 13, the channel in the p-type base region 24 disappears and the semiconductor device 100 turns to an off state.

When the semiconductor device 100 switches to the off state, the positive voltage applied to the drain electrode 10 increases. On the other hand, a negative voltage (or ground voltage) relative to the drain electrode 10 is applied to the source electrode 14. As a result, a depletion layer spreads from the interface between the n$^-$-type drift region 22 and the first insulating portion 41, provided around the first conductive portion 31 serving as a field plate electrode, toward the n$^-$-type drift region 22. Furthermore, a depletion layer spreads from the interface between the n$^-$-type drift region 22 and the third insulating portion 43, provided around the second conductive portion 32 toward the n$^-$-type drift region 22. The spread of the depletion layer can prevent concentration of electric field in the n$^-$-type drift region 22 and increase the breakdown voltage of the semiconductor device 100. Alternatively, the n-type impurity concentration in the n$^-$-type drift region 22 can be increased and the on resistance of the semiconductor device 100 can be reduced while maintaining the breakdown voltage of the semiconductor device 100.

(Method for Manufacturing Semiconductor Device 100)

FIGS. 4A through 12B are cross-sectional process diagrams illustrating aspects of a process for manufacturing the semiconductor device 100 according to the first embodiment.

Figure 4A:
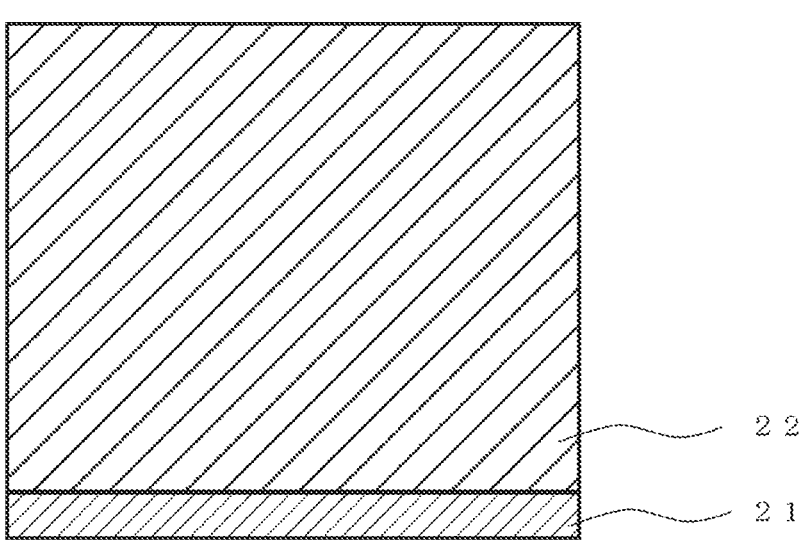
FIGS. 4A and 4B are diagrams illustrating aspects of a method for manufacturing a semiconductor device according to a first embodiment.

First, an n$^+$-type semiconductor substrate 21 is prepared. The semiconductor substrate 21 is an n$^+$-type semiconductor region 21. As shown in FIG. 4A, an n$^-$-type semiconductor region 22 is formed through epitaxial growth on the n$^+$-type semiconductor region 21 in the Z direction.

Figure 4B:
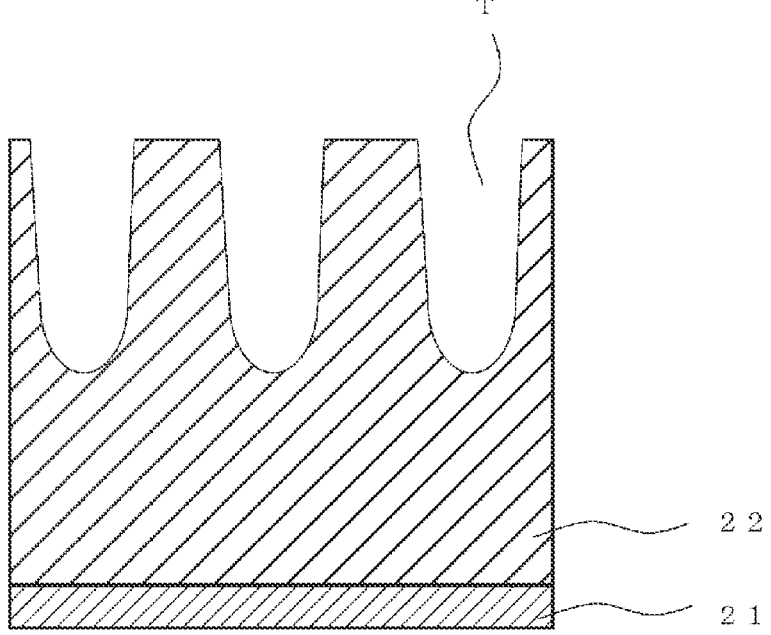

As shown in FIG. 4B, a plurality of trenches T are formed by reactive ion etching (RIE) into the upper surface of the n$^-$-type semiconductor region 22. The trenches T extend lengthwise in the Y direction.

Figure 5A:
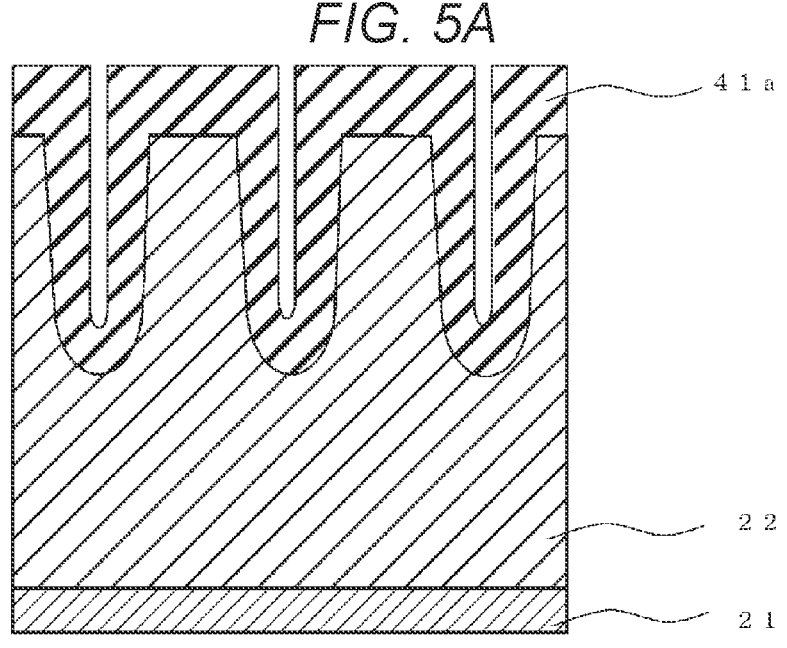
FIGS. 5A and 5B are diagrams illustrating aspects of a method for manufacturing a semiconductor device according to a first embodiment.

As shown in FIG. 5A, a first insulating layer 41a is formed along the upper surface of the n$^-$-type semiconductor region 22 and the interior surfaces of the trenches T. The first insulating layer 41a can be formed by thermally oxidizing the n$^-$-type semiconductor region 22. Alternatively, the first insulating layer 41a may be formed by depositing material by chemical vapor deposition (CVD). The first insulating layer 41a comprises silicon oxide.

Figure 5B:
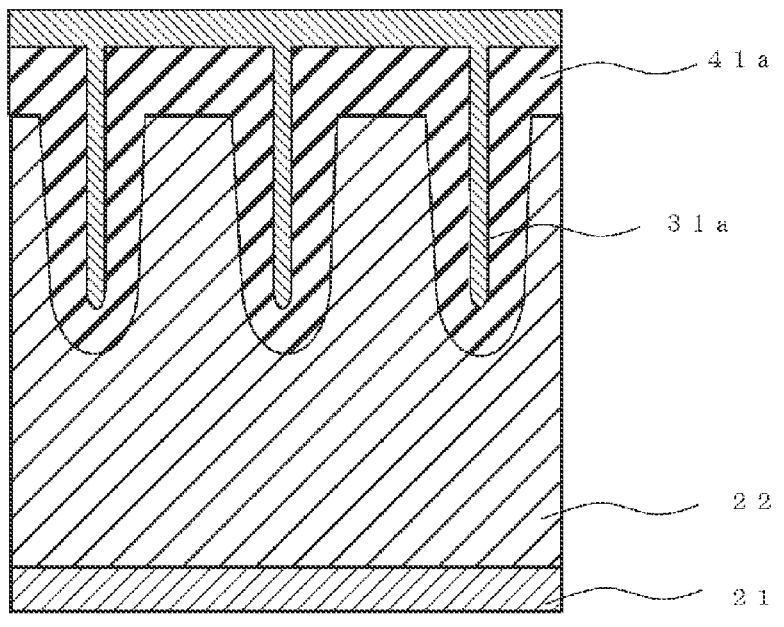

As shown in FIG. 5B, a conductive layer 31a is formed on the first insulating layer 41a by CVD such that the conductive layer 31a fills the trenches T. The conductive layer 31a is made of, for example, polysilicon and contains a conductive impurity such as phosphorus or boron.

Figure 6A:
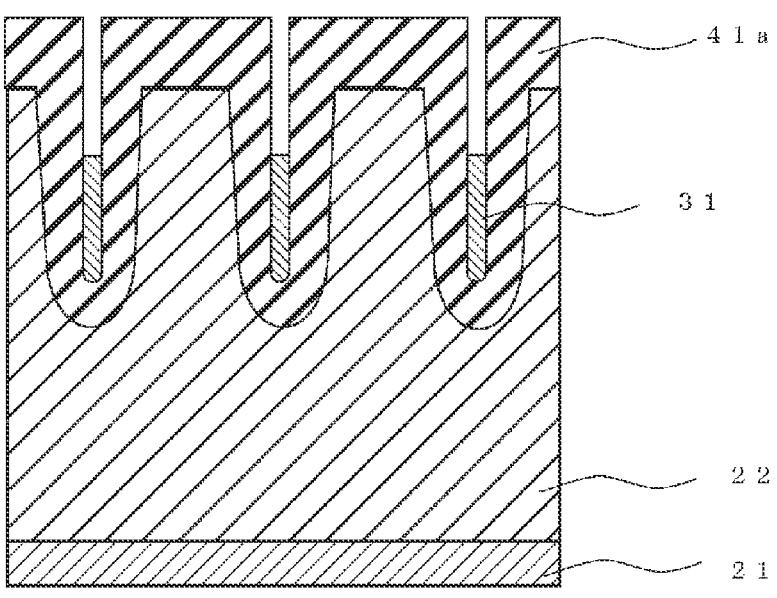
FIGS. 6A and 6B are diagrams illustrating aspects of a method for manufacturing the semiconductor device according to a first embodiment.

As shown in FIG. 6A, the conductive layer 31a is partly removed by reactive ion etching (RIE) to form a first conductive portion 31 within the trenches T.

Figure 6B:
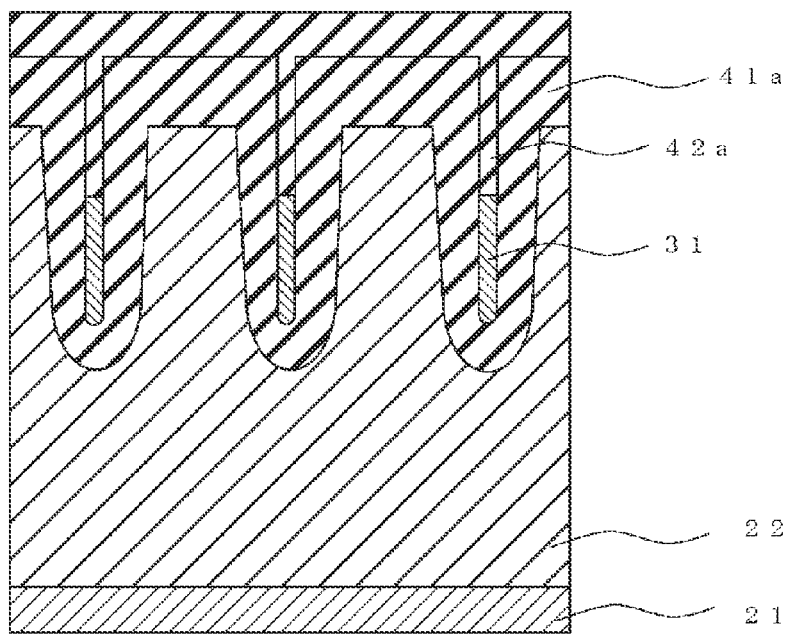

As shown in FIG. 6B, a part of a second insulating portion 42 (here, as second insulating layer 42a) is formed by CVD on the first conductive portion 31 and the first insulating layer 41a.

Figure 7A:
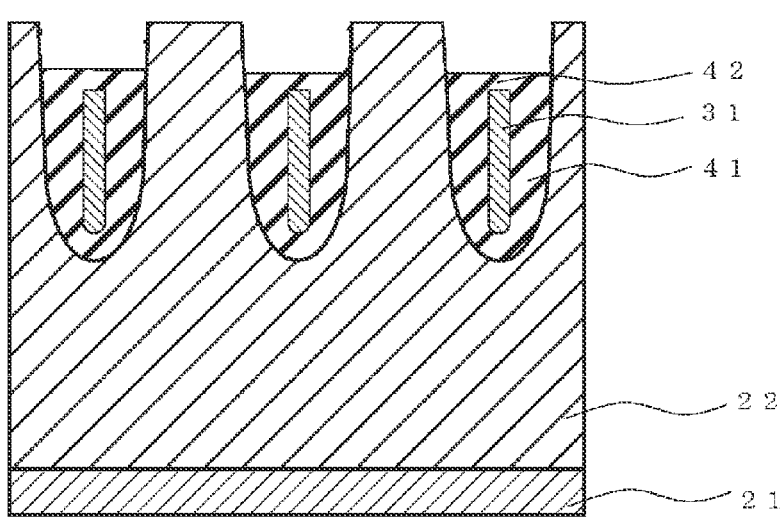
FIGS. 7A and 7B are diagrams illustrating aspects of a method for manufacturing a semiconductor device according to a first embodiment.
Figure 7B:
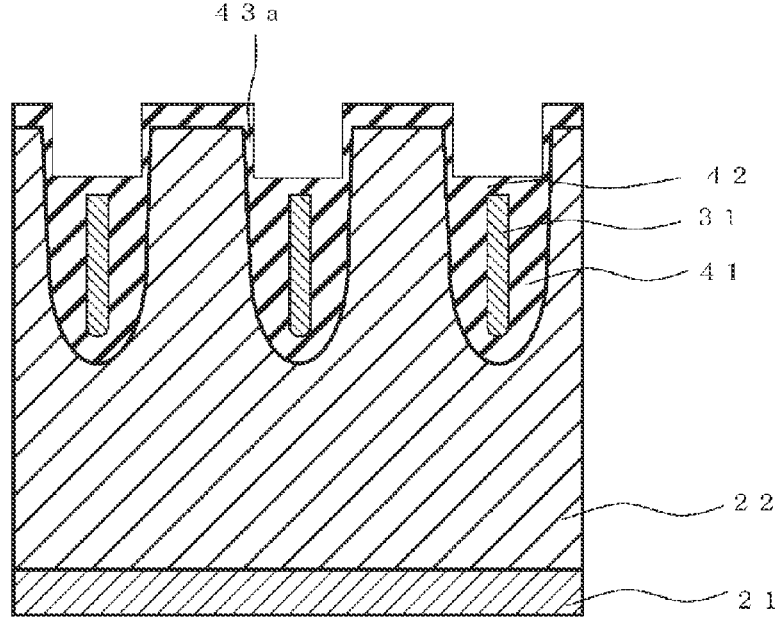

A part of the first insulating layer 41a and a part of the second insulating layer 42a are then removed by wet etching or CDE (chemical dry etching), thereby retracting the upper surfaces of the first insulating layer 41a and the second insulating layer 42a and forming a first insulating portion 41 and a part of a second insulating portion 42. In this process step, as shown in FIG. 7A, the upper surface of the n$^-$-type semiconductor region 22 becomes exposed. Side surfaces of the n$^-$-type semiconductor region 22 become exposed on the interior walls of the trenches T.

Thereafter, the upper and side surfaces of the n$^-$-type semiconductor region 22 are oxidized by an oxidation treatment. A third insulating layer 43a is formed by the oxidation of the surface of the n$^-$-type semiconductor region 22.

Figure 8A:
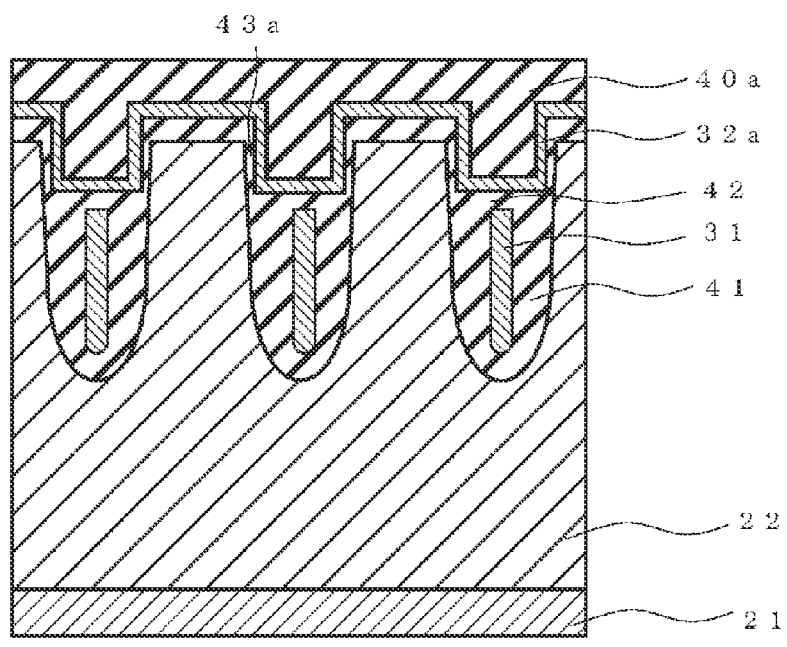
FIGS. 8A and 8B are diagrams illustrating aspects of a method for manufacturing a semiconductor device according to a first embodiment.

As shown in FIG. 8A, a conductive layer 32a is formed by CVD on the second insulating portion 42 and the third insulating layer 43a. The conductive layer 32a is made of, for example, polysilicon and may contain a conductive impurity (e.g., phosphorus). Subsequently, an insulating layer 40a is formed on the conductive layer 32a by CVD.

Figure 8B:
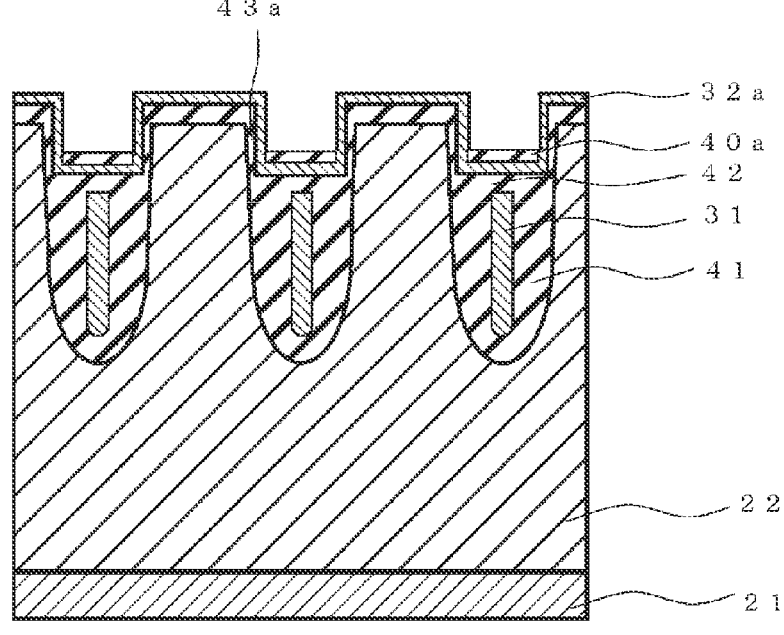

As shown in FIG. 8B, the insulating layer 40a is partly removed by wet etching or CDE. Part of the insulating layer 40a is left on the conductive layer 32a in the trenches T.

Figure 9A:
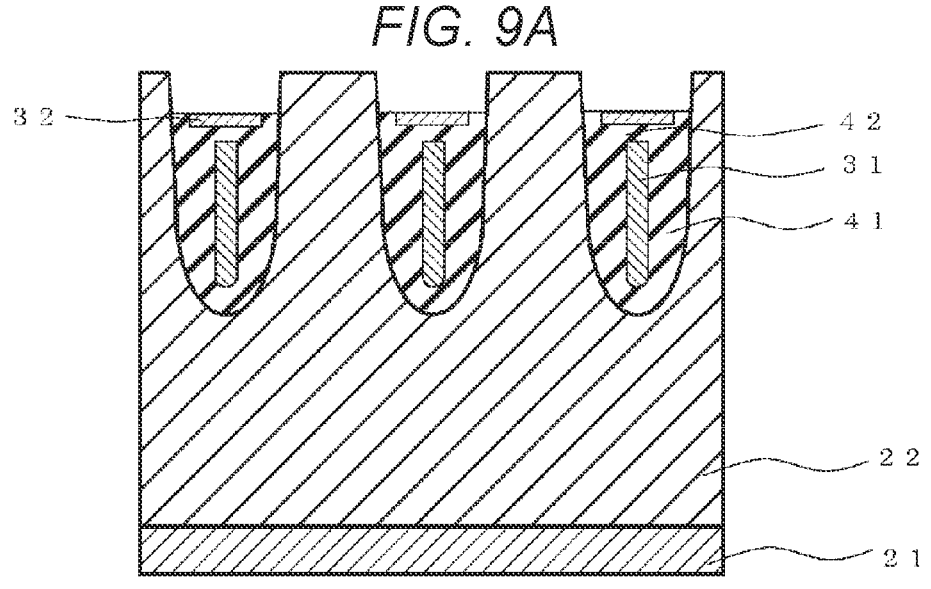
FIGS. 9A and 9B are diagrams illustrating aspects of a method for manufacturing a semiconductor device according to a first embodiment.

As shown in FIG. 9A, the conductive layer 32a is partly removed by reactive ion etching (RIE) or CDE to form the second conductive portion 32. Thereafter, the insulating layer 40a on the second conductive portion 32 and the third insulating layer 43a on the first semiconductor region 20 are removed by wet etching or CDE.

Figure 9B:
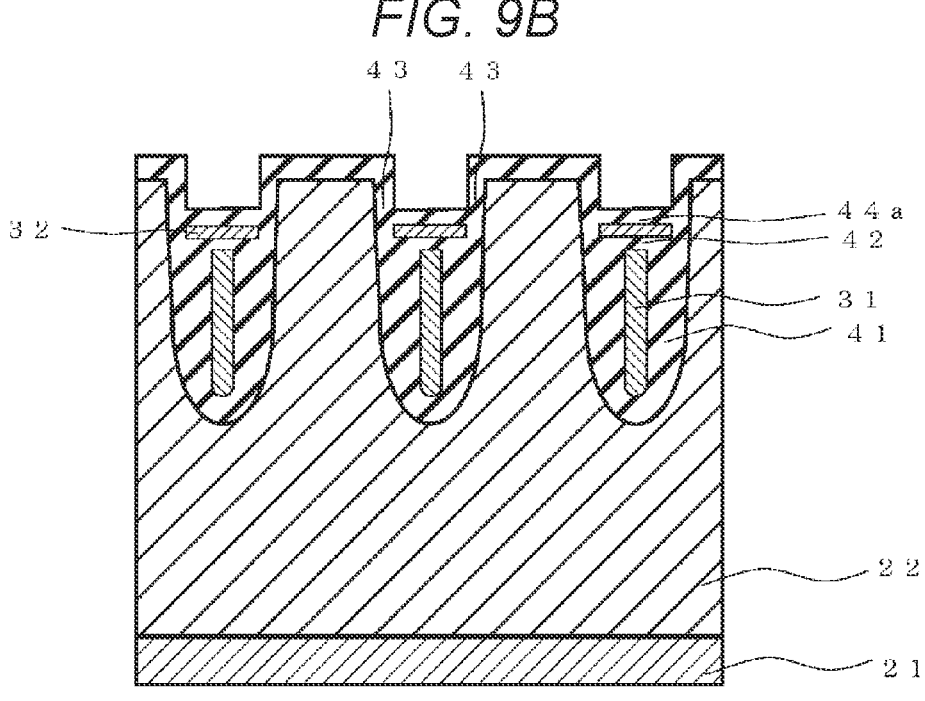

The upper and side surfaces of the n$^-$-type semiconductor region 22 and the upper surface of the second conductive portion 32 are then oxidized by an oxidation treatment. As shown in FIG. 9B, a fourth insulating layer 44a is formed by the oxidation of the upper surface of the second conductive portion 32. A third insulating portion 43 is formed by the oxidation of the surface of the n$^-$-type semiconductor region 22.

Figure 10A:
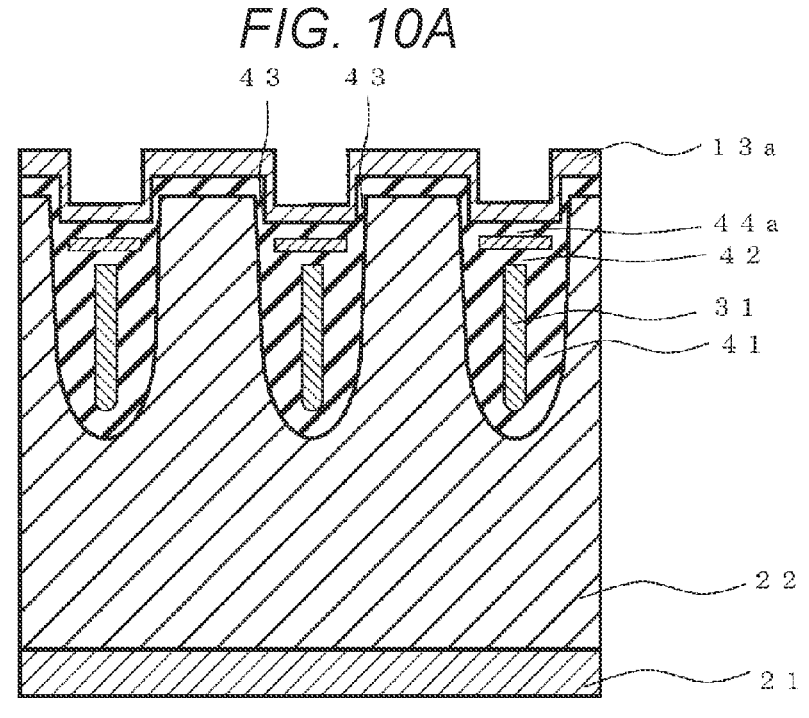
FIGS. 10A and 10B are diagrams illustrating aspects of a method for manufacturing a semiconductor device according to a first embodiment.

As shown in FIG. 10A, a conductive layer 13a is formed by CVD on the third insulating portion 43, the fourth insulating layer 44a, and the n$^-$-type drift region 22. The conductive layer 13a comprises polysilicon. The conductive layer 13a may contain a conductive impurity (e.g., phosphorus).

Figure 10B:
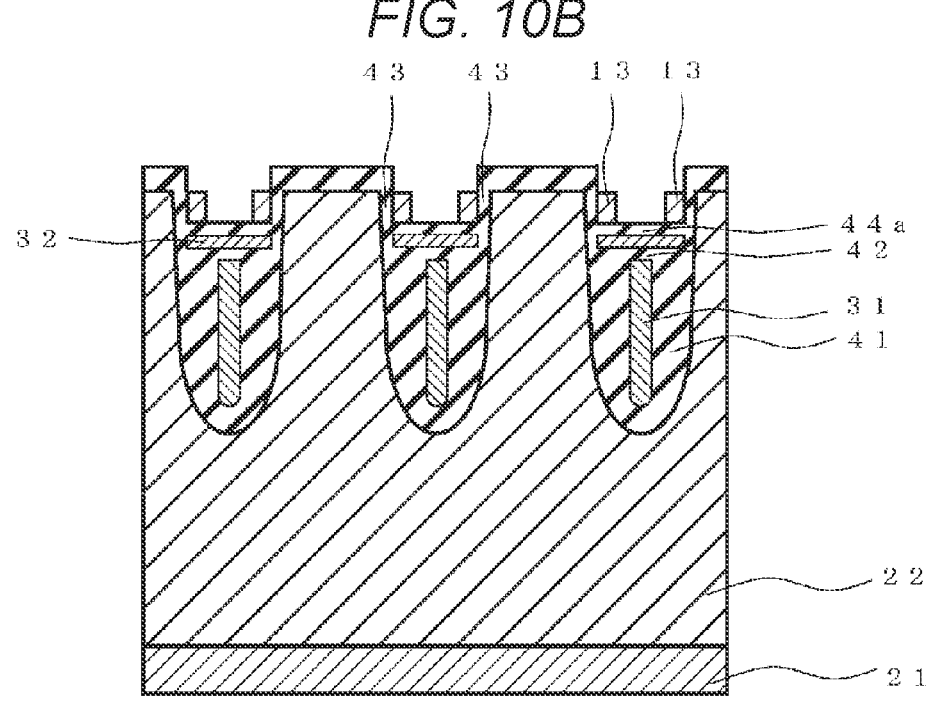

The conductive layer 13a is partly removed by RIE or the like to retract the upper surface of the conductive layer 13a to form a gate electrode 13 in each trench T, as shown in FIG. 10B.

Figures 11A, 11B:
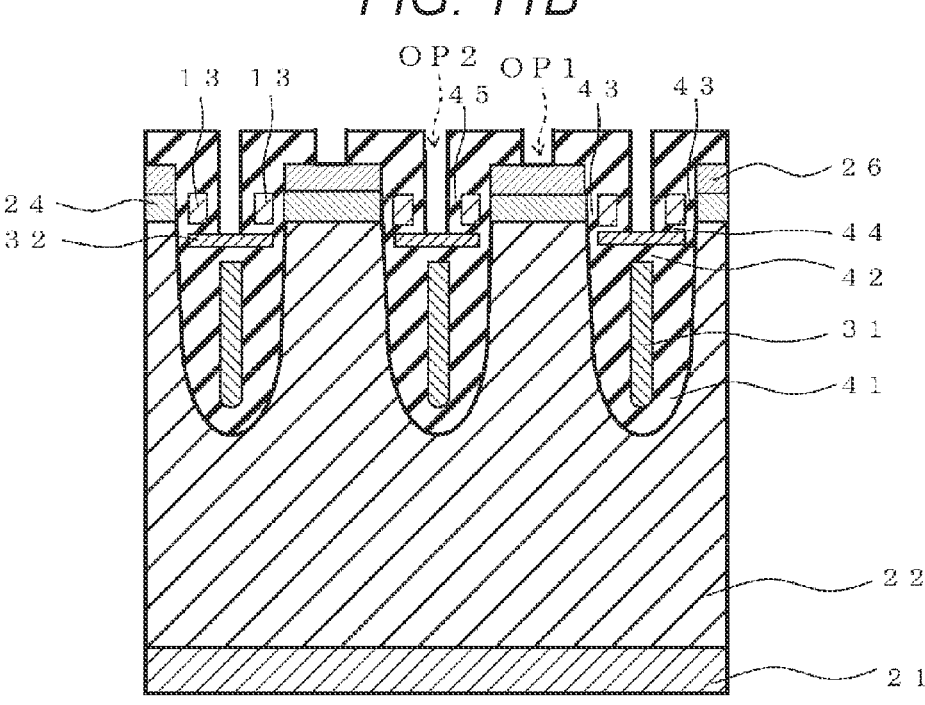
FIGS. 11A and 11B are diagrams illustrating aspects of a method for manufacturing a semiconductor device according to a first embodiment.

As shown in FIG. 11A, p-type impurity ions and n-type impurity ions are successively implanted into a top portion of the n$^-$-type semiconductor region 22 to form a p-type base region 24 and an n$^+$-type source region 26. Thereafter, a fifth insulating layer 45a, which covers the gate electrode 13, the third insulating portion 43, the fourth insulating layer 44a and the n$^+$-type source region 26, is formed.

As shown in FIG. 11B, portions of the fifth insulating layer 45a on the n$^+$-type source region 26 is partly removed to form an upper portion of a first opening OP1 that passes through the n$^+$-type source region 26 and reaches the p-type base region 24, and to expose a part of the n$^+$-type source region 26. Furthermore, portions of the fourth insulating layer 44a and the fifth insulating layer 45a formed above the second conductive portion 32 are partly removed to form a fourth insulating portion 44 and a fifth insulating portion 45 with a second opening OP2 that passes through the fifth insulating portion 45 and the fourth insulating portion 44 and reaches the second conductive portion 32, and exposing a part of the second conductive portion 32.

Figure 12A:
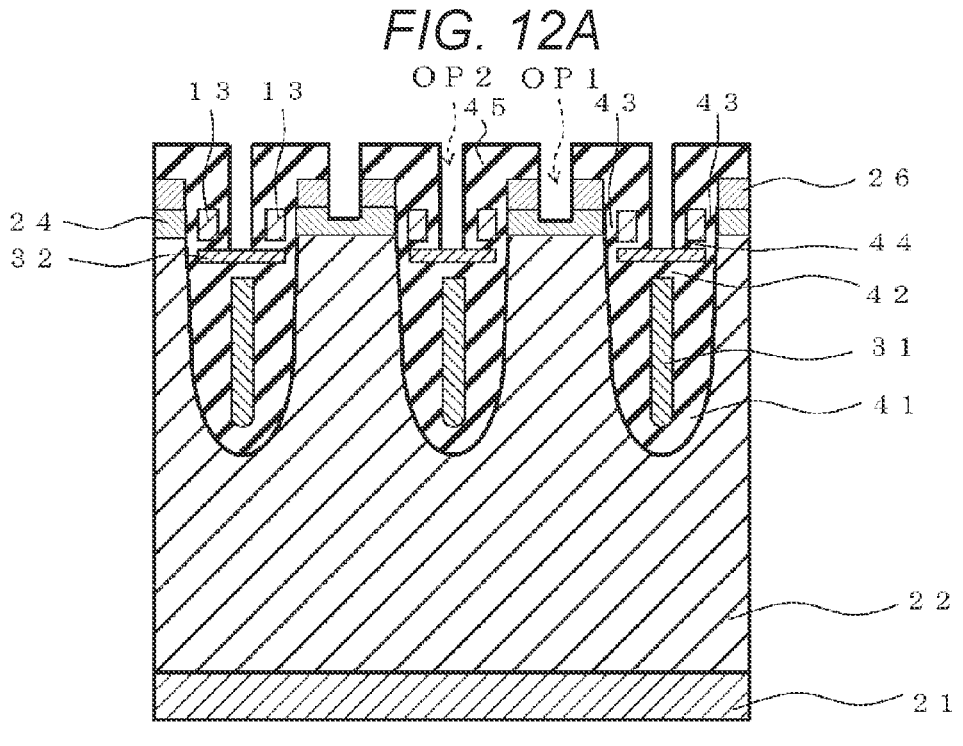
FIGS. 12A and 12B are diagrams illustrating aspects of a method for manufacturing a semiconductor device according to a first embodiment.

Thereafter, as shown in FIG. 12A, the n$^+$-type source region 26 is partly removed to extend the first opening OP1 through the n$^+$-type source region 26 to reach the p-type base region 24, thereby exposing a part (a sidewall surface) of the n$^+$-type source region 26 and a part of the p-type base region 24.

Figure 12B:
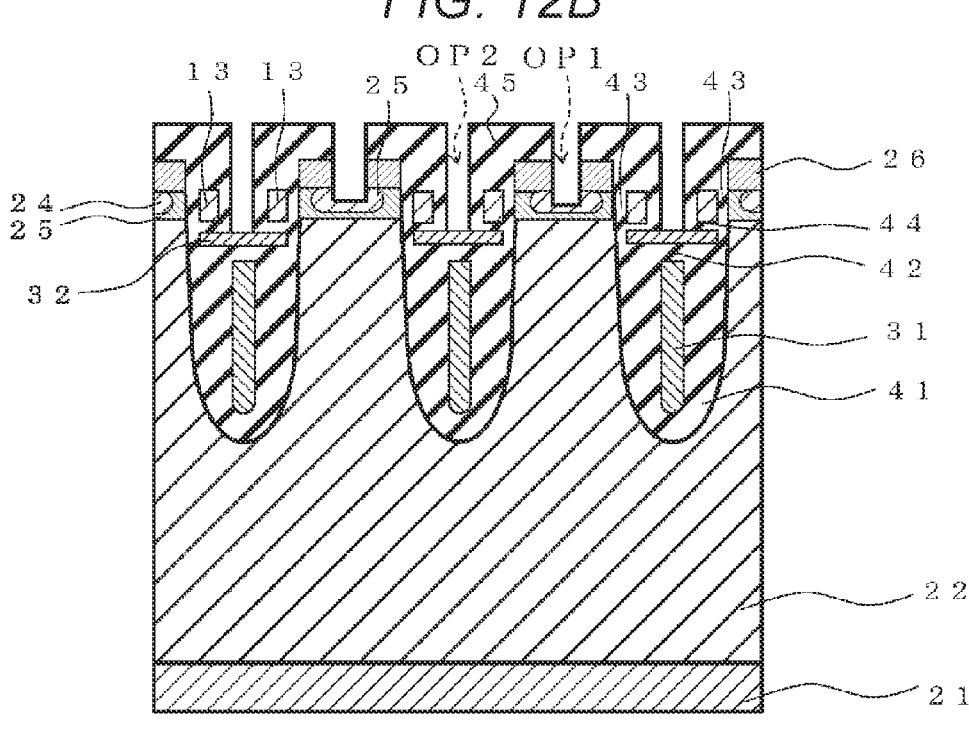

As shown in FIG. 12B, p-type impurity ions are implanted into the exposed p-type base region 24 to form a p$^+$-type contact region 25. Thereafter, a first portion 15 and a second portion 16 of a source electrode 14, which fill the first opening OP1 and the second opening OP2, are formed on the fifth insulating portion 45. A drain electrode 10 is formed under the n$^+$-type drain region 21. The semiconductor device 100 shown in FIG. 1 can thus be manufactured through the process steps described above.

(Advantageous Effects of the First Embodiment)

Figure 13:
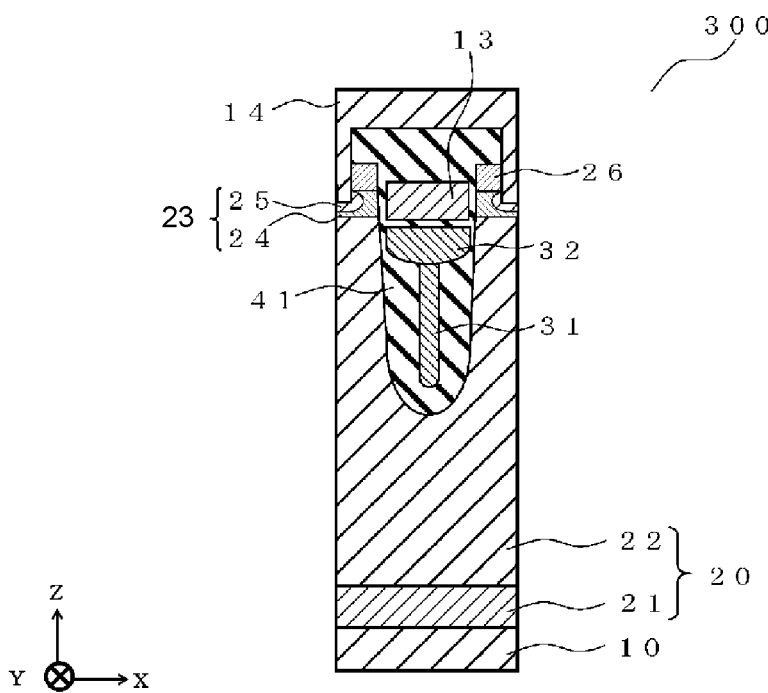
FIG. 13 is a cross-sectional view of a comparative semiconductor device.

Advantageous effects achieved by the semiconductor device 100 will now be described in comparison with a comparative semiconductor device 300 shown in FIG. 13.

The comparative semiconductor device 300 differs from the semiconductor device 100 in that the second portion 16 of the source electrode 14 is not provided. Also, the width of the gate electrode 13 in the X direction is greater than that of the semiconductor device 100. The comparative semiconductor device 300 further differs from the semiconductor device 100 in that the first conductive portion 31-side surface (the lower surface) of the second conductive portion 32 has a large curvature.

When the total width of the gate electrode 13 in the X direction is large, such as in the comparative semiconductor device 300, the opposing area between the bottom of the gate electrode 13 and the drift region 22 is large, so that the gate-drain capacitance Cgd (which is one of the parasitic capacitances) will be large. The larger the gate-drain capacitance Cgd, the longer it takes for electric current to reach a steady state value during the turn-on operation and for electric current to stop flowing during the turn-off operation, resulting in a switching loss. Therefore, the gate-drain capacitance Cgd is preferably as small as possible.

Since the total X-direction width of the gate electrode 13 of the semiconductor device 100 according to the first embodiment is smaller than that of the comparative semiconductor device 300, the gate-drain capacitance Cgd is reduced. The semiconductor device 100 according to the first embodiment can therefore have a reduced (lower) switching loss.

The greater the electric field generated between the gate electrode 13 and the drift region 22, the larger the gate-drain capacitance Cgd and the quantity of electric charge Qgd. In the semiconductor device 100, the second conductive portion 32 (which is electrically connected to the source electrode 14) is present between the gate electrode 13 and the drift region 22. Therefore, the semiconductor device 100 can block the electric field between the gate electrode 13 and the drift region 22, thereby reducing the gate-drain capacitance Cgd and the quantity of electric charge Qgd.

Since the semiconductor device 100 according to the first embodiment is provided with the second conductive portion 32, the total thickness of the second insulating portion 42 and the fourth insulating portion 44 between the gate electrode 13 and the drift region 22 is reduced by the thickness of the second conductive portion 32. Therefore, the semiconductor device 100 according to the first embodiment can have a reduced gate-drain capacitance Cgd (and the quantity of electric charge Qgd) and an enhanced switching efficiency.

The semiconductor device 100 according to the first embodiment and the comparative semiconductor device 300 are both provided with a second conductive portion 32 which extends in the X direction and thus has a portion adjacent to the gate electrode 13 via the fourth insulating portion 44. Therefore, a depletion layer spreads from the interface between the n⁻-type drift region 22 and the third insulating portion 43/the fourth insulating portion 44, which are in contact with a lower portion of the gate electrode 13, toward the n⁻-type drift region 22. The spread of the depletion layer can prevent concentration of electric field in the lower portion of the gate electrode 13 and increase the breakdown voltage of the semiconductor device 100.

In the semiconductor device 100, the curvature of the first conductive portion 31-side surface (lower surface) of the second conductive portion 32 is less than that of the comparative semiconductor device 300. In the semiconductor device 100, the second conductive portion 32 has well-formed, sharp corner portions on the lower side. Electric field is likely to concentrate at these lower corner portions of the second conductive portion 32. This can prevent concentration of electric field at a lower portion of the gate electrode 13.

The X-direction position of the surface of the second conductive portion 32 that is in contact with the third insulating portion 43 is preferably closer to the first semiconductor region 20 than is the X-direction position of the surface of the gate electrode 13 that is in contact with the third insulating portion 43. With such an arrangement, the electric field is more likely to concentrate at the lower corner portions of the second conductive portion 32. This can prevent concentration of the electric field at a lower portion of the gate electrode 13. Furthermore, the X-direction thickness of the third insulating portion 43 between the gate electrode 13 and the first semiconductor region 20 is reduced by this arrangement. Therefore, the semiconductor device 100 according to the first embodiment can further have a reduced gate-drain capacitance Cgd and an enhanced switching efficiency.

The semiconductor device 100 can prevent the occurrence of dynamic avalanche during an off operation. Upon an off operation of a MOSFET, there is a possibility of that a phenomenon called "dynamic avalanche" in which the holes that remain in a semiconductor layer without being discharged begin to concentrate, causing a reduction in the breakdown voltage of the MOSFET. In addition, a MOSFET in which dynamic avalanche has occurred has current losses and a reduction in switching efficiency.

For the semiconductor device 100, a region right above the second conductive portion 32 is connected directly to the second portion 16 of the source electrode 14; therefore, the resistance of the second conductive portion 32 in the Z direction can be reduced. Thus, holes that have entered the first conductive portion 31 and the second conductive portion 32 during an off-operation can be efficiently discharged from the source electrode 14. This can prevent the occurrence of dynamic avalanche in the semiconductor device 100 during an off-operation.

It is possible in the comparative semiconductor device 300 that a surge current from the drain electrode 10 may pass through the first conductive portion 31 and the second conductive portion 32 via the insulating layer 40, and then be inputted to the gate electrode 13. If the surge current is input to the gate electrode 13, the potential of the gate electrode 13 will rise, causing a phenomenon called "self-turn-on" in which the MOSFET which is initially in an off state automatically turns to an on state without a change in gate control signal or the like.

In the semiconductor device 100 according to the first embodiment, a region above the second conductive portion 32 is connected directly to the second portion 16 of the source electrode 14. Accordingly, a surge current from the drain electrode 10 can be discharged to the source electrode 14 through the second portion 16 after passing through the first conductive portion 31 and the second conductive portion 32 via the insulating layer 40. The semiconductor device 100 can therefore prevent concentration of electric field at the bottom of the gate electrode 13, increase the breakdown voltage, enhance the switching efficiency, and prevent self-turn-on.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first electrode;
a second electrode spaced from the first electrode in a first direction;
a first semiconductor region of a first conductivity type between the first electrode and the second electrode and electrically connected to the first electrode;
a plurality of second semiconductor regions of a second conductivity type between the first semiconductor region and the second electrode and spaced from one another in a second direction intersecting the first direction;
a third semiconductor region of the first conductivity type electrically connected to the second electrode and between the second semiconductor regions and the second electrode in the first direction;
a first conductive portion adjacent to the first semiconductor region in the second direction;
a first insulating portion between the first conductive portion and the first semiconductor region in the second direction;
a gate electrode between adjacent pairs of the second semiconductor regions in the second direction;
a second conductive portion between the first conductive portion and the gate electrode in the first direction;
a second insulating portion between the first conductive portion and the second conductive portion in the first direction;
a third insulating portion between the gate electrode and adjacent second semiconductor regions in the second direction and the first semiconductor region and the second conductive portion in the second direction; and
a fourth insulating portion between the gate electrode and the second conductive portion in the first direction, wherein
the second electrode has a first portion spaced from the third semiconductor region in the first direction and a second portion that extends from the first portion in the first direction and contacts the second conductive portion.

2. The semiconductor device according to claim 1, wherein the second conductive portion is adjacent to the gate electrode in the first direction via the fourth insulating portion.

3. The semiconductor device according to claim 2, wherein a distance from the second conductive portion to the first semiconductor region along the second direction is less than a distance from the gate electrode to the first semiconductor region along the second direction.

4. The semiconductor device according to claim 1, wherein
the gate electrode between the adjacent pairs of the second semiconductor regions has a first part closer to a first one the pair of second semiconductor regions in the second direction and a second part closer to a second one the pair of second semiconductor regions, and the second portion of the second electrode is between the first and second parts of the gate electrode in the second direction.

5. The semiconductor device according to claim 4, wherein the second conductive portion is adjacent to the first and second parts of gate electrode in the first direction via the fourth insulating portion.

6. The semiconductor device according to claim 1, wherein the second electrode includes a third portion extending from the first portion in the first direction, the third portion being electrically connected to the second and third semiconductor regions.

7. The semiconductor device according to claim 1, wherein the second conductive portion comprises polysilicon.

8. The semiconductor device according to claim 1, wherein
the first conductivity type is n-type, and
the second conductivity type is p-type.

9. The semiconductor device according to claim 1, wherein the first conductive portion and the second conductive portion are electrically connected to the second electrode.

10. A semiconductor device, comprising:
a semiconductor layer;
a first electrode on a first side of the semiconductor layer;
a second electrode on a second side of the semiconductor layer;
a plurality of trenches extending into the semiconductor layer in a first direction from the second side of the semiconductor layer and spaced from one another in a second direction intersecting the first direction, wherein
the second electrode includes:
a first portion separated from the semiconductor layer in the first direction,
a second portion extending in the first direction from the first portion into the plurality of trenches, and
a third portion extending in the first direction from the first portion into the semiconductor layer between adjacent trenches in the second direction,
the semiconductor layer includes:
a first semiconductor region of a first conductivity type between the first electrode and the second electrode and electrically connected to the first electrode,
a plurality of second semiconductor regions of a second conductivity type between the first semiconductor region and the second electrode and spaced from one another in the second direction, and
a third semiconductor region of the first conductivity type electrically connected to the second electrode and between the second semiconductor regions and the second electrode in the first direction, and
each trench has therein:
an insulating material,
a first conductive portion adjacent to the first semiconductor region in the second direction, a first insulating portion of the insulating material being between the first conductive portion and the first semiconductor region in the second direction,
a gate electrode between adjacent pairs of the second semiconductor regions in the second direction, and
a second conductive portion between the first conductive portion and the gate electrode in the first direction, a second insulating portion of the insulating material being between the first conductive portion and the second conductive portion in the first direction, a third insulating portion of the insulating material is between the gate electrode and adjacent second semiconductor regions in the second direction and the first semiconductor region and the second conductive portion in the second direction, and a fourth insulating portion of the insulating material is between the gate electrode and the second conductive portion in the first direction.

11. The semiconductor device according to claim 10, wherein the first conductive portion and the second conductive portion are electrically connected to the second electrode.

12. The semiconductor device according to claim 10, wherein the second conductive portion is below the gate electrode in the first direction.

13. The semiconductor device according to claim 10, wherein the second conductive portion comprises polysilicon.

14. The semiconductor device according to claim 10, wherein the gate electrode in each trench has a first part closer to a first one the adjacent second semiconductor regions in the second direction and a second part closer to a second one of the adjacent second semiconductor regions in the second direction, and the second portion of the second electrode is between the first and second parts of the gate electrode in the second direction.

15. The semiconductor device according to claim 10, wherein a distance from the second conductive portion to the first semiconductor region along the second direction is less than a distance from the gate electrode to the first semiconductor region along the second direction.

16. The semiconductor device according to claim 10, wherein the semiconductor layer is silicon.

17. A method of manufacturing a semiconductor device, the method comprising:

forming a trench in a first semiconductor region of a first conductivity type, the trench extending in a first direction into the first semiconductor region from a first side;

forming a first insulating portion on the first side and an inner wall surface of the trench;

forming a first conductive portion in the trench on the first insulating portion;

removing an upper portion of the first conductive portion and then forming a second insulating portion in the trench on a remaining lower portion of the first conductive portion;

removing a part of the first insulating portion and a part of the second insulating portion from the trench to expose an upper part of the inner wall surface;

forming a second conductive portion in the trench on an upper surface of a remaining part of the first and second insulating portions;

oxidizing a part of the second conductive portion to form a third insulating portion on the upper part of the inner wall surface of the trench and a fourth insulating portion on an upper surface of the second conductive portion;

forming a gate electrode in the trench on a surface of the third insulating portion and a part of the fourth insulating portion;

forming a second semiconductor region of a second conductivity type in the first semiconductor region, the second semiconductor region being adjacent to the gate electrode via the third insulating portion in the second direction; and forming a third semiconductor region of the first conductivity type above the second semiconductor region in the first direction.

18. The method according to claim 17, wherein the second conductive portion is polysilicon.

19. The method according to claim 17, further comprising:

forming a first electrode on a second side of the first semiconductor region.

20. The method according to claim 19, the method further comprising:

forming a second electrode on the first side of the first semiconductor region, the second electrode including a portion in the first direction into the trench and contacting the second conductive portion, and another portion extending in the first direction into the second semiconductor region.

* * * * *